(12) United States Patent
Liu et al.

(10) Patent No.: US 11,064,613 B2
(45) Date of Patent: Jul. 13, 2021

(54) ELECTRONICS ENCAPSULATION THROUGH HOTMELT LAMINATION

(71) Applicant: Flex Ltd., Singapore (SG)

(72) Inventors: Weifeng Liu, Dublin, CA (US);
William L. Uy, San Jose, CA (US);
Dongkai Shangguan, San Jose, CA (US)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 16/450,650

(22) Filed: Jun. 24, 2019

(65) Prior Publication Data

US 2020/0344891 A1 Oct. 29, 2020

Related U.S. Application Data

(60) Provisional application No. 62/838,803, filed on Apr. 25, 2019.

(51) Int. Cl.

| | | |
|---|---|---|
| H05K 5/00 | (2006.01) | |
| H05K 3/28 | (2006.01) | |
| H05K 1/18 | (2006.01) | |
| H05K 5/06 | (2006.01) | |
| B29C 51/10 | (2006.01) | |
| B29C 51/12 | (2006.01) | |
| B29L 31/34 | (2006.01) | |
| B29K 105/00 | (2006.01) | |

(52) U.S. Cl.
CPC ............. *H05K 3/284* (2013.01); *B29C 51/10* (2013.01); *B29C 51/12* (2013.01); *H05K 1/189* (2013.01); *H05K 5/065* (2013.01); *B29K 2105/0097* (2013.01); *B29L 2031/3425* (2013.01); *H05K 2203/1322* (2013.01)

(58) Field of Classification Search
None
See application file for complete search history.

(56) References Cited

U.S. PATENT DOCUMENTS

| | | | | |
|---|---|---|---|---|
| 9,105,714 | B2 * | 8/2015 | Hu | ............ H01L 25/0753 |
| 9,425,173 | B2 * | 8/2016 | Rhee | ............ H01L 25/0753 |
| 2007/0090387 | A1 * | 4/2007 | Daniels | ............ H01L 24/75 |
| | | | | 257/99 |

(Continued)

OTHER PUBLICATIONS

"Versatility on a roll: Bonding and welding with thermoplastic adhesive films," Pontacol AG, Feb. 2017, 8 pages.

(Continued)

*Primary Examiner* — Anthony Q Edwards
*Assistant Examiner* — Rashen E Morrison
(74) *Attorney, Agent, or Firm* — Sheridan Ross P.C.

(57) ABSTRACT

Methods, devices, and systems for encapsulating a flexible electronic device with a waterproof layer are provided. In some embodiments, a manufacturing process is provided where a hotmelt layer is positioned over a flexible substrate that has at least one electronic component. Then, heat and/or pressure are applied to the hotmelt layer causing the hotmelt layer to flow around the at least one component to encapsulate the at least one component and form a waterproof layer. Various embodiments for forming the hotmelt layer and various embodiments of the flexible electronic device with the hotmelt layer are described herein.

16 Claims, 12 Drawing Sheets

(56) References Cited

U.S. PATENT DOCUMENTS

2009/0114928 A1* 5/2009 Messere ............ B32B 17/10541
257/88
2009/0272950 A1* 11/2009 Lu .............................. C09J 4/06
252/585
2018/0277725 A1* 9/2018 Xiong ................... H01L 33/486

OTHER PUBLICATIONS

"Thermoplastic Polyurethane Elastomers-Elastollan Material Properties," BASF, Sep. 2017, 52 pages.

* cited by examiner

ELECTRONICS ENCAPSULATION THROUGH HOTMELT LAMINATION

CROSS REFERENCE TO RELATED APPLICATION

The present application claims the benefits of and priority, under 35 U.S.C. § 119(e), to U.S. Provisional Application Ser. No. 62/838,803 filed Apr. 25, 2019, entitled "ELECTRONICS ENCAPSULATION THROUGH HOTMELT LAMINATION," of which the entire disclosure is incorporated herein by reference, in its entirety, for all purposes and for all purposes.

FIELD

The present disclosure is generally directed to systems and methods for encapsulating electronic systems.

BACKGROUND

Flexible electronic devices are becoming more desirable due to a wide range of possible applications since flexible electronic devices can vary in shape with a human body in motion or conform to the rounded shape of a body part. For example, an electronic playbook can conform to an arm of an athlete or an electronic map can conform to an arm of a soldier. However, the use of flexible materials rather than rigid materials found in desktop or mobile computers affects both the flexible electronic device itself and manufacturing process to make the flexible electronic device. This in combination with the new possible applications of a flexible electronic device that cause the electronic device to stretch and move introduces issues. For instance, a flexible electronic device would need to be waterproof for use on a human body while retaining flexibility. Thus, there is a need for encapsulating electronics on a flexible substrate with a waterproof layer as well as a method for manufacturing the same.

Previous encapsulating methods have several drawbacks. For example, when injectors are used to dispense material to encapsulate electronics, the cycle time is long and the throughput is low. In addition, the system may require a dam or mold, and the injectors can cause the material to form dome shapes. Low pressure molding is a further method for encapsulating electronics. However, this method is limited to few materials such as polyamide. Further, due to pressure and temperature requirements, the mold tooling is expensive and the throughput is relatively moderate. Yet another method for encapsulating electronics is screen printing. However, this method is limited to printing a thin dielectric layer and is not able to cover tall electronic components. Beyond specific processes, hotmelt materials have been used to adhere, for instance, two pieces of fabric together in manufacturing processes. Using hotmelt in this manner requires a thin hotmelt layer and results in a bonded fabric.

BRIEF SUMMARY

Systems, methods, and apparatuses of the present disclosure address these and other issues with previous manufacturing processes. A hotmelt lamination process and the resulting flexible electronic device described herein utilize a hotmelt layer that has excellent bonding with substrates, electronic components, connectors, metals, etc. The hotmelt layer encapsulates electronic components in a waterproof layer that has a low porosity and is also sufficiently flexible.

According to one embodiment, a manufacturing process is provided where the operating temperature for forming the hotmelt layer is low enough to avoid damage to electronic components. Electronic components can have intricate circuitry and delicate materials that are sensitive to heat, and conventional encapsulation methods often operate at temperatures or heat fluxes that result in damage to the electronic components. Embodiments of the present disclosure include operating temperatures that are more than 50° C. higher than an ambient temperature to cause the hotmelt layer to flow between electronic components but less than 150° C. to prevent damage to the electronic components. Further, the operating temperature can be less than 120° C. in some embodiments. It will be appreciated that these temperatures are exemplary in nature, and embodiments of the disclosure can include other temperatures and temperature ranges depending on the materials used and end-use application.

According to one embodiment, various layers such as a cover layer are included for the application of a flexible electronic device and also to aid in the manufacturing process. A cover layer can be formed on an outer surface of the hotmelt layer to provide or enhance desirable characteristics and/or withhold or suppress undesirable characteristics of the finished product. For example, the cover layer can provide or enhance desirable characteristics such as anti-scratch characteristics, color, fabric texture, etc. In addition, during production a hotmelt layer can be first poured onto the cover layer using a hotmelt coater or a slot die coater to accommodate the larger thickness of the hotmelt layer. The thickness of the hotmelt layer can be 1 mm or greater in various embodiments. In various embodiments, the hotmelt layer is greater than 2 mm. Moreover, the hotmelt layer can be applied as a single layer, applied as multiple layers at once, applied as multiple layers in series, etc. Subsequently, the hotmelt layer and cover layer can be rotated and placed on a flexible substrate. It will be appreciated that the above thicknesses of the hotmelt layer are exemplary in nature, and embodiments of the disclosure can encompass different thicknesses depending on the materials used and end-use application.

According to one embodiment, one or more hotmelt layers can be cooled from an operating temperature to a lower temperature such that the hotmelt layer reconstitutes in its new position. In contrast to prior manufacturing methods where hotmelt is used to adhere two pieces of fabric, the hotmelt layer in the present disclosure can require a cooling step to reconstitute the thicker hotmelt layer to keep the hotmelt layer in the desired position and to avoid subjecting sensitive electronic components to the operating temperature for prolonged periods of time.

It is a further aspect of embodiments of the present disclosure to provide a hotmelt material and additional materials. Example hotmelt materials include, but are not limited to, ethylene-vinyl acetate ("EVA"), thermoplastic polyurethane ("TPU"), silicone, polyamide, amorphous poly alpha olefins ("APAO"), and polyethylene. Example additional materials, such as a cover material, that can be used in combination with the hotmelt material or materials include, but are not limited to, TPU, polyethylene terephthalate ("PET"), and silicone. It will be appreciated that in some embodiments, the hotmelt material can be used alone or in combination with additional materials.

These and other advantages will be apparent from the disclosure of the aspects, embodiments, and configurations contained herein.

Unless otherwise noted, all component or composition levels are in reference to the active portion of that component or composition and are exclusive of impurities, for example, residual solvents or by-products, which may be present in commercially available sources of such components or compositions.

All percentages and ratios are calculated by total composition weight, unless indicated otherwise.

It should be understood that every maximum numerical limitation given throughout this disclosure is deemed to include each and every lower numerical limitation as an alternative, as if such lower numerical limitations were expressly written herein. Every minimum numerical limitation given throughout this disclosure is deemed to include each and every higher numerical limitation as an alternative, as if such higher numerical limitations were expressly written herein. Every numerical range given throughout this disclosure is deemed to include each and every narrower numerical range that falls within such broader numerical range, as if such narrower numerical ranges were all expressly written herein. By way of example, the phrase from about 2 to about 4 includes the whole number and/or integer ranges from about 2 to about 3, from about 3 to about 4 and each possible range based on real (e.g., irrational and/or rational) numbers, such as from about 2.1 to about 4.9, from about 2.1 to about 3.4, and so on.

The preceding is a simplified summary of the disclosure to provide an understanding of some aspects of the disclosure. This summary is neither an extensive nor exhaustive overview of the disclosure and its various aspects, embodiments, and configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and configurations of the disclosure are possible utilizing, alone or in combination, one or more of the features set forth above or described in detail below.

BRIEF DESCRIPTION OF THE DRAWINGS

The accompanying drawings are incorporated into and form a part of the specification to illustrate several examples of the present disclosure. These drawings, together with the description, explain the principles of the disclosure. The drawings simply illustrate preferred and alternative examples of how the disclosure can be made and used and are not to be construed as limiting the disclosure to only the illustrated and described examples. Further features and advantages will become apparent from the following, more detailed, description of the various aspects, embodiments, and configurations of the disclosure, as illustrated by the drawings referenced below.

It should be understood that the diagrams are provided for example purposes only and should not be read as limiting the scope of the disclosure. Many other configurations are fully contemplated and included in the scope of the disclosure.

DETAILED DESCRIPTION

It is with respect to the above issues and other problems that the embodiments presented herein were contemplated. In general, embodiments of the present disclosure provide methods, devices, and systems for providing a hotmelt layer over electronic components and a flexible substrate. The use of hotmelt as a waterproof layer is unprecedented in electronics manufacturing, and the embodiments described herein describe various ways to apply a hotmelt layer to electronic components and a flexible substrate. The resulting flexible electronic device is both waterproof and flexible in nature. These benefits and others along with various embodiments are described herein.

Figure 1:
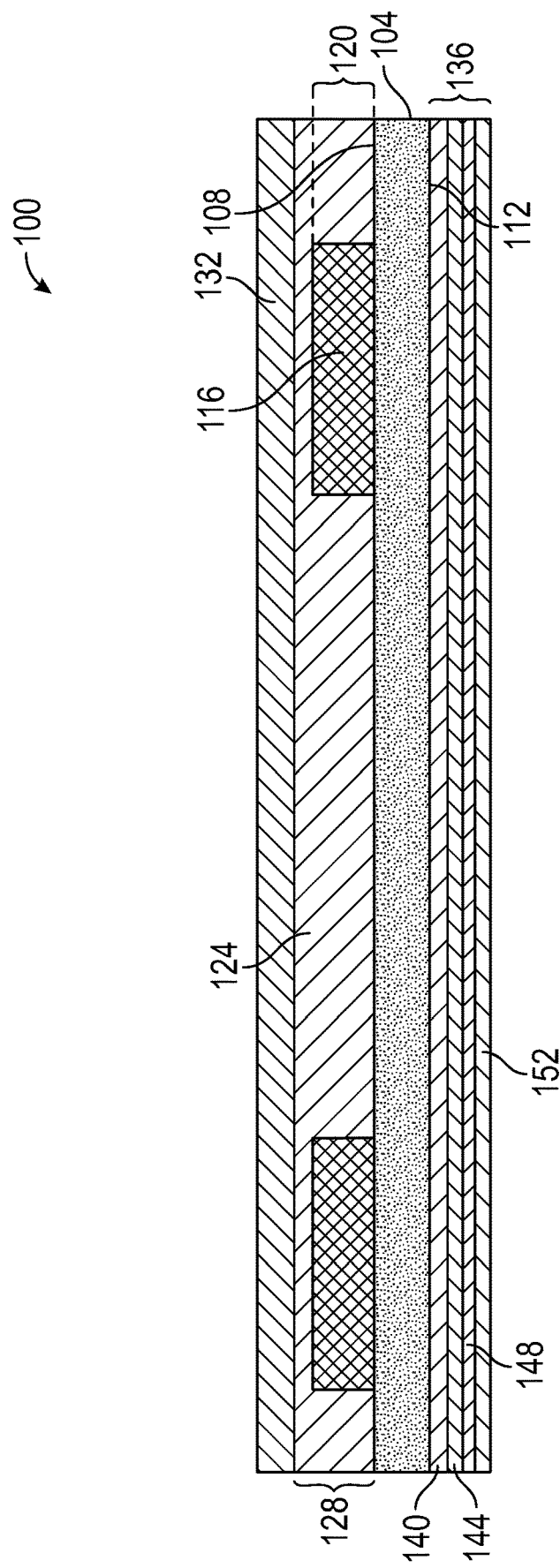
FIG. 1 is a cross-sectional side view of a hotmelt encapsulated electronic device in accordance with embodiments of the present disclosure.

FIG. 1 is a cross-sectional side view of an exemplary embodiment of a flexible electronic device 100 that has a hotmelt layer. As shown, a substrate 104 has a substantially planar shape with a top surface 108 and a bottom surface 112. An electronic component 116 can be positioned on the top surface 108 of the substrate 104 in this embodiment, and the electronic component 116 extends above the top surface 108 by a component height 120. Multiple electronic components 116 can be positioned on the top surface 108 of the substrate 104, and wires can operably join the components 116. While electronic components 116 and wires are described, it will be appreciated that other components utilized in electronic circuitry can be positioned on the top surface 108 of the substrate 104. In addition, the electronic components 116 can have different component heights 120 above the top surface 108. Thus, the individual component heights 120 can be used to describe aspects the flexible electronic device 100 in some embodiments, and in various embodiments, a maximum component height 120 can be used to describe aspects of the flexible electronic device 100.

Next, a hotmelt layer 124 is positioned over the electronic components 116, and, with pressure and/or heat, the hotmelt layer 124 flows into the spaces between the electronic components 116 to encapsulate the electronic components 116 in a waterproof layer. The hotmelt layer 124 has a hotmelt height 128 above the top surface 108 of the substrate 104. The outer surface of the hotmelt layer 124 may be a constant distance from the top surface 108 of the substrate 104. In other words, the hotmelt height 128 may be constant. In other embodiments, the outer surface of the hotmelt layer 124 varies in distance from the top surface 108 of the substrate 104, and the hotmelt height 128 varies. In the embodiments where the hotmelt height 128 is constant, the hotmelt height 128 is greater than the component height 120 and/or the maximum component height 120 in the case of multiple electronic components. In the embodiments where the hotmelt height 128 is varying, a maximum hotmelt height 128 can be greater than a maximum component height 120. When there are multiple electronic components, a local maximum hotmelt height 128 over an electronic component can be greater than the local maximum component height 120 over that same electronic component but be less than another maximum component height 120 over another electronic component.

A cover layer 132 can be positioned on the outer surface of the hotmelt layer 124 before, during, or after heat and/or pressure is applied to the hotmelt layer 124. The cover layer 132 can be a fabric in some embodiments that provides a particular tactile feel for a consumer. In various embodiments, the cover layer 132 can have cut outs that, for example, correspond to electrical contacts, etc. A bottom layer 136 can be positioned on the bottom surface 112 of the substrate 104 as shown. The bottom layer 136 can comprise several constituent layers such as a hotmelt layer 140 positioned on the bottom surface 112 of the substrate 104, a support layer 144 positioned on an outer surface of the hotmelt layer 140, a pressure sensitive adhesive layer 148 positioned on an outer surface of the support layer 144, and a liner film 152 positioned on an outer surface of the support layer 144.

The hotmelt layer 140, like the hotmelt layer 124 on the other surface of the substrate 104, provides a waterproof layer over the substrate 104 and any electronic components on the bottom surface 112 of the substrate 104. Though the bottom surface 112 of the substrate 104 is depicted as not having any electronic components, it will be appreciated that the bottom surface 112 can have one or more electronic components and other electronic components as described above with respect to the top surface 108. Further, the hotmelt layer 140 can have a constant or varying hotmelt height over the electronic components and component heights as described above with respect to the hotmelt layer 124 on the top surface 108. The support layer 144 provides a surface for the pressure sensitive adhesive layer 148, which can be used for skin contact. Lastly, the liner film 152 can help preserve the adhesive layer 148 before use. Therefore, after production, the liner film 152 can be removed from the adhesive layer 148, and the flexible electronic device can be pressed into a surface, such as a portion of a human body, and the adhesive layer 148 joins the flexible electronic device to the surface.

Figure 2A:
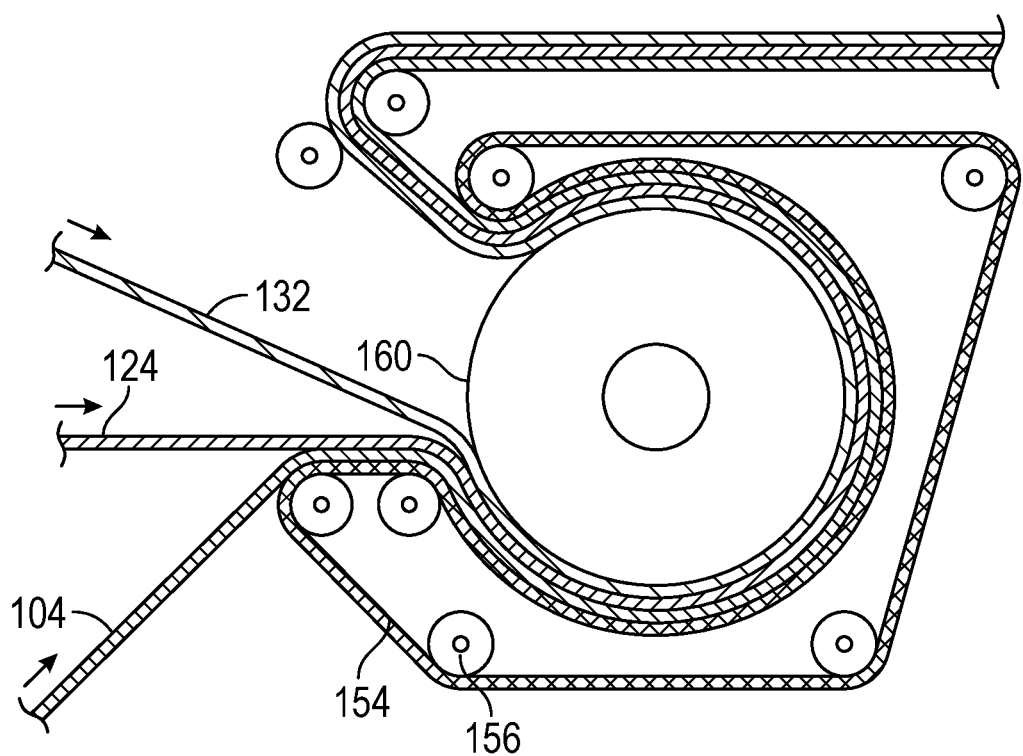
FIG. 2A is a side elevation view of a manufacturing process for a hotmelt encapsulated electronic device in accordance with embodiments of the present disclosure.

FIGS. 2A-2E show exemplary manufacturing apparatuses and processes for producing the flexible electronic device described herein. FIG. 2A shows a manufacturing apparatus that continuously produces the flexible electronic device. In this example, a cover layer 132, a hotmelt layer 124, and a substrate 104 are drawn from respective sources. For example, these components 104, 124, 132 can be stored in respective rolls that are subsequently drawn into the manufacturing apparatus. The substrate 104 may also have one or more electronic components positioned on the top surface of the substrate 104. The manufacturing apparatus can utilize a number of rollers 156 that drive a continuous belt 154 that draws the components 104, 124, 132 into the apparatus. The rollers 156 and continuous belt 154 wrap the components 104, 124, 132 onto each other and around a large heated roller 160. The heated roller 160 has an operating temperature that is greater than the ambient temperature, as described herein, to soften the hotmelt layer 124 and cause the hotmelt layer 124 to flow into spaces between electronic components on the substrate 104. In addition, the rollers 156 define a perimeter that the continuous belt 154 follows with the exception of the large roller 160, which is at least partially positioned within this perimeter. As a result, the continuous belt 154 exerts a force or pressure against the components 104, 124, 132 through the planar direction, or in other words, perpendicular to the planar dimension of the components 104, 124, 132. This force or pressure presses the hotmelt layer 124 and the substrate 104 together such that the hotmelt layer 124 flows into spaces between electronic components on the substrate 104. The components 104, 124, 132 can then move to a post-processing cool down and/or curing area, if necessary.

Figure 2B:
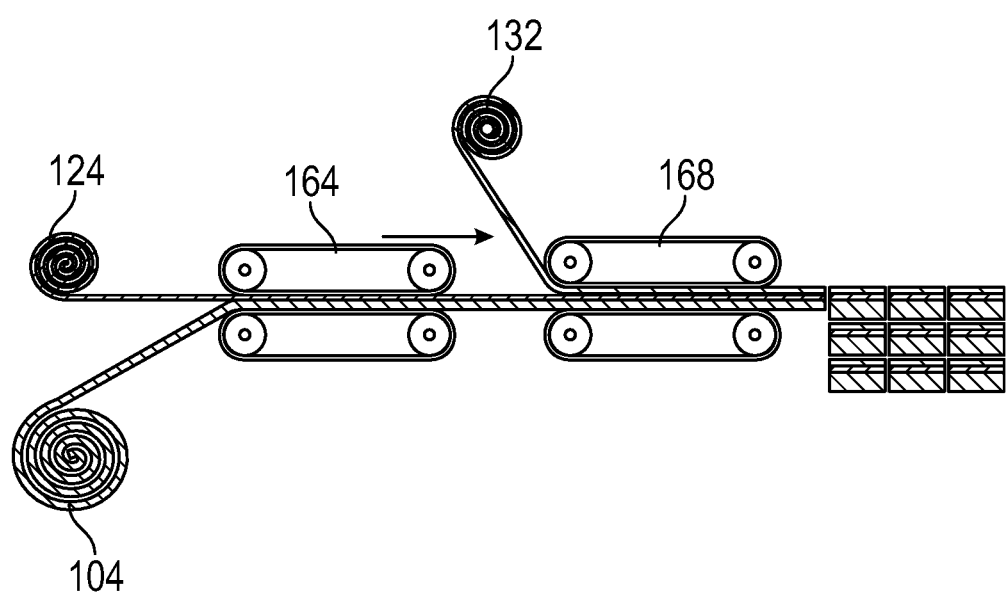
FIG. 2B is a side elevation view of another manufacturing process for a hotmelt encapsulated electronic device in accordance with embodiments of the present disclosure.

FIG. 2B shows a flat bed laminator that has a heating band 164 and a cooling band 168. As described above, the substrate 104, the hotmelt layer 124, and the cover layer 132 can be stored in respective rolls and then drawn into the manufacturing apparatus. The substrate 104 and the hotmelt layer 124 are first drawn together and then pass into the heating band 164. The heating band 164 has an operating temperature that is higher than the ambient temperature, as described elsewhere herein. In addition, the heating band 164 can have a sub-band on the top surface of the components 104, 124 and a sub-band on the bottom surface of the components 104, 124. This arrangement of sub-bands can more evenly heat the components 104, 124 can also exert a force or pressure through the components 104, 124 in a direction that is perpendicular to the planar dimension of the components 104, 124. The combination of heat and pressure causes the hotmelt layer 124 to flow in the spaces between the electronic components of the substrate 104.

After the heating band 164, a cover layer 132 is added to the outer surface of the hotmelt layer 124. As described elsewhere herein, the cover layer 132 can be a fabric or other material that is aesthetic, provides a tactile feel for the consumer, or otherwise engages the consumer. The cover layer 132 can comprise a further hotmelt layer that is heated before being combined with the other hotmelt layer 124. The cover layer 132 is positioned on the hotmelt layer 124, and the components 104, 124, 132 are drawn into a cooling band 168 that has an operating temperature that is less than the operating temperature of the heating band 164. In some embodiments, the operating temperature of the cooling band 168 is equal to or less than the ambient temperature, and in various embodiments, the operating temperature of the cooling band 168 is equal to or greater than the ambient temperature. Like the heating band 164, the cooling band 168 can have a sub-band positioned on the top side of the components 104, 124, 132 and another sub-band positioned on the bottom side of the components 104, 124, 132. The sub-band exert forces in opposing directions through the components 104, 124, 132 to cool the hotmelt layer 124 and encapsulate the electronic components on the substrate 104 in a waterproof layer.

Figure 2C:
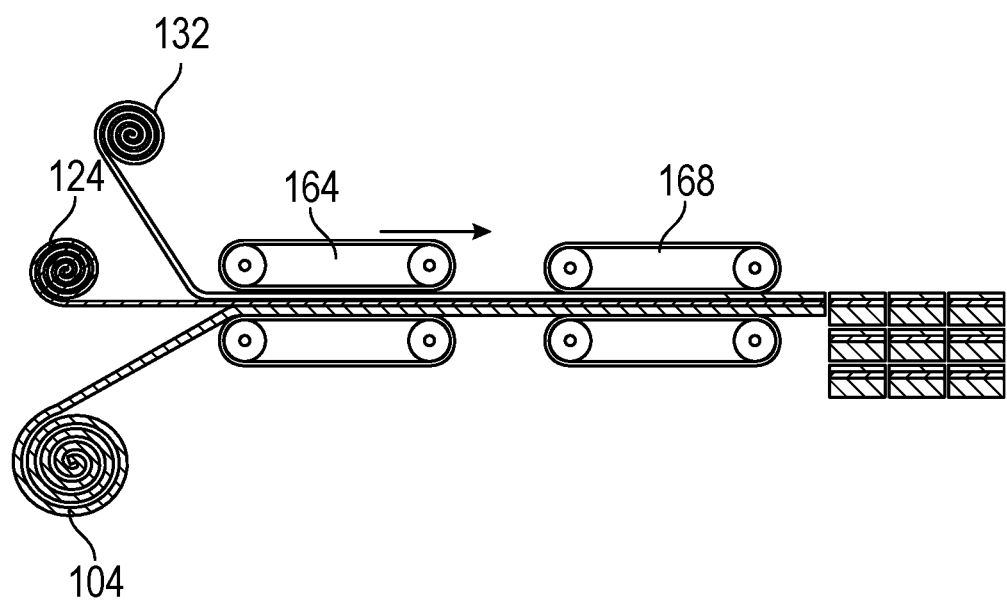
FIG. 2C is a side elevation view of a further manufacturing process for a hotmelt encapsulated electronic device in accordance with embodiments of the present disclosure.

FIG. 2C shows a further embodiment of a flat bed laminator. The two bands 164, 168 can both be described as heating bands where the first heating band 164 has a first operating temperature, and the second heating band 168 has a second operating temperature that can be distinct from the first operating temperature. In various embodiments, the components 104, 124, 132 cool in the ambient environment after passing the heating bands 164, 168 without the aid of forced convection or a cooling band. Further still, the components 104, 124, 132 can be combined prior to entering the first heating band 164.

Figure 2D:
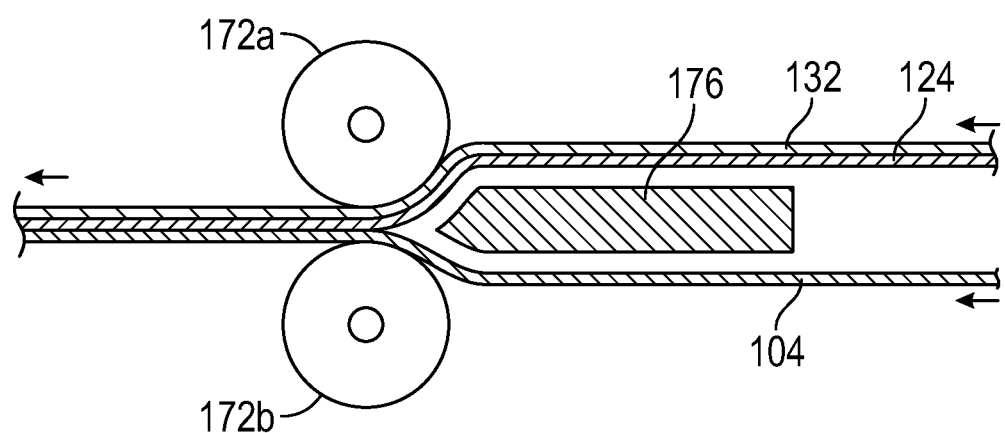
FIG. 2D is a side elevation view of yet another manufacturing process for a hotmelt encapsulated electronic device in accordance with embodiments of the present disclosure.

FIG. 2D shows a hot wedge apparatus for combining components or layers. As before, the components 104, 124, 132 can be stored in respective rolls and then drawn into the manufacturing apparatus. In this embodiment, rollers 172a, 172b draw the components 104, 124, 132 around a hot wedge 176 that has an operating temperature that is higher than the ambient temperature. The substrate 104 is positioned below the hot wedge 176 and the hotmelt layer 124 and the cover layer 132 are positioned above the hot wedge 176. After passing the hot wedge 176, all components 104, 124, 132 are joined and then pass through the space between the rollers 172a, 172b. The space between the rollers 172a, 172b can be less than a combined thickness of the components 104, 124, 132 before passing through the rollers 172a, 172b, which results in a force or pressure exerted on the components 104, 124, 132 that is perpendicular to the planar dimension of the components 104, 124, 132. The combination of heat and pressure cause the hotmelt layer 124 to flow in the spaces between electronic components on the substrate 104.

Figure 2E:
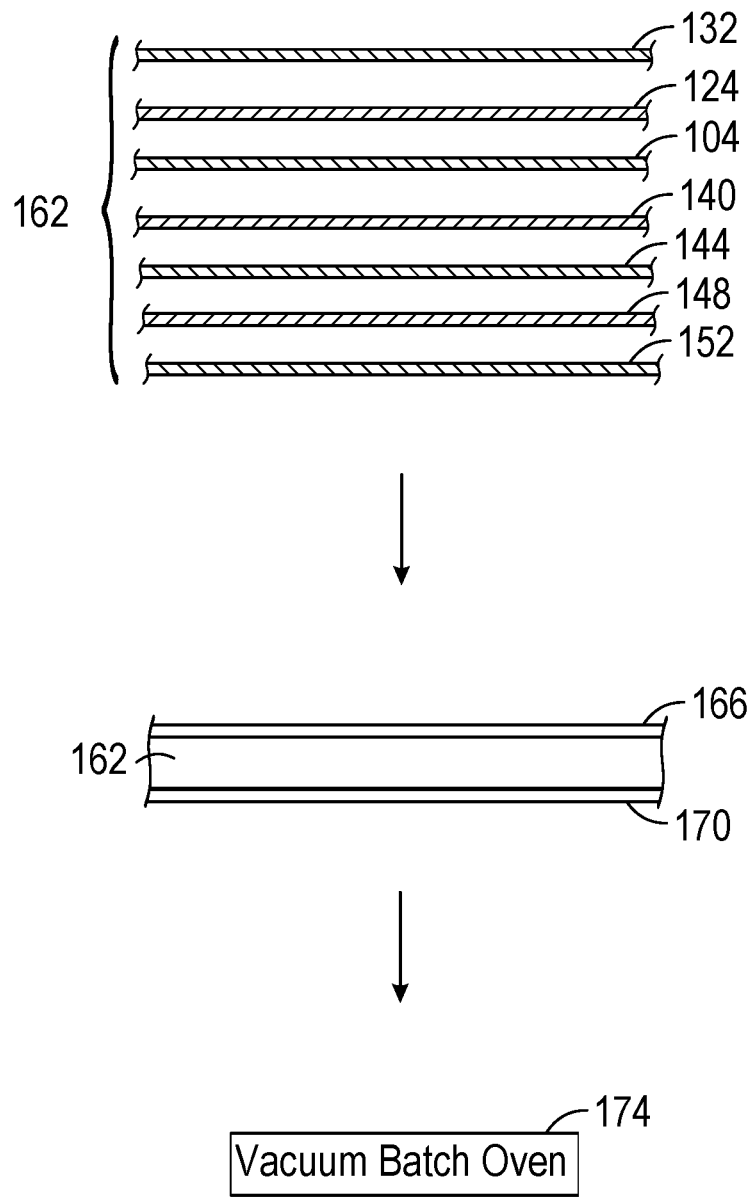
FIG. 2E is a side elevation view of a further manufacturing process for a hotmelt encapsulated electronic device in accordance with embodiments of the present disclosure.

FIG. 2E shows a sheet lamination process that utilizes a vacuum batch oven. First, the various layers 132, 124, 104, 140, 144, 148, 152 are assembled on each other to form a rough stack 162. The various layers 132, 124, 104, 140, 144, 148, 152 from FIG. 1 are depicted in FIG. 2E, but it will be appreciated that any variation of layers 132, 124, 104, 140, 144, 148, 152 or stack 162 described herein can be used with the sheet lamination process.

After the layers 132, 124, 104, 140, 144, 148, 152 are assembled, the stack 162 is positioned on a tray 170 with an optional weight 166 on top of the stack 162. When the layers 132, 124, 104, 140, 144, 148, 152 are assembled, small air or gas pockets can be trapped between the layers 132, 124, 104, 140, 144, 148, 152. These pockets are undesirable as air or gas can prevent complete waterproofing of the electronic device or otherwise inhibit the functions of the various layers 132, 124, 104, 140, 144, 148, 152. The optional weight 166 can provide a force perpendicular to the planar direction of the layers 132, 124, 104, 140, 144, 148, 152 to help drive out the undesirable air or gas. In addition, an aperture can be created through one or more of the layers 132, 124, 104, 140, 144, 148, 152 to provide an escape path for air or gas.

Lastly, the stack 162, the tray 170, and the weight 166 are placed in a vacuum batch oven 174 that controls heat and/or pressure. An operating pressure in the vacuum batch oven 174 that is lower than the ambient pressure can be used to help remove air or gasses from between the layers 132, 124, 104, 140, 144, 148, 152 or from the layers themselves during manufacturing. The vacuum batch oven 174 can combine a lowered pressure, such as a vacuum, with an elevated temperature to remove any air or gases between the layers 132, 124, 104, 140, 144, 148, 152 and promote the bond between the layers 132, 124, 104, 140, 144, 148, 152, including the flow of the hotmelt layer between electronic components. It will be appreciated that the manufacturing apparatuses in FIGS. 2A-2E are exemplary in nature and are non-limiting. A manufacturing apparatus in one of these figures can, for example, add operations, eliminate operations, combine a greater number of layers or components, combine a fewer number of layers or components, etc.

Figure 3:
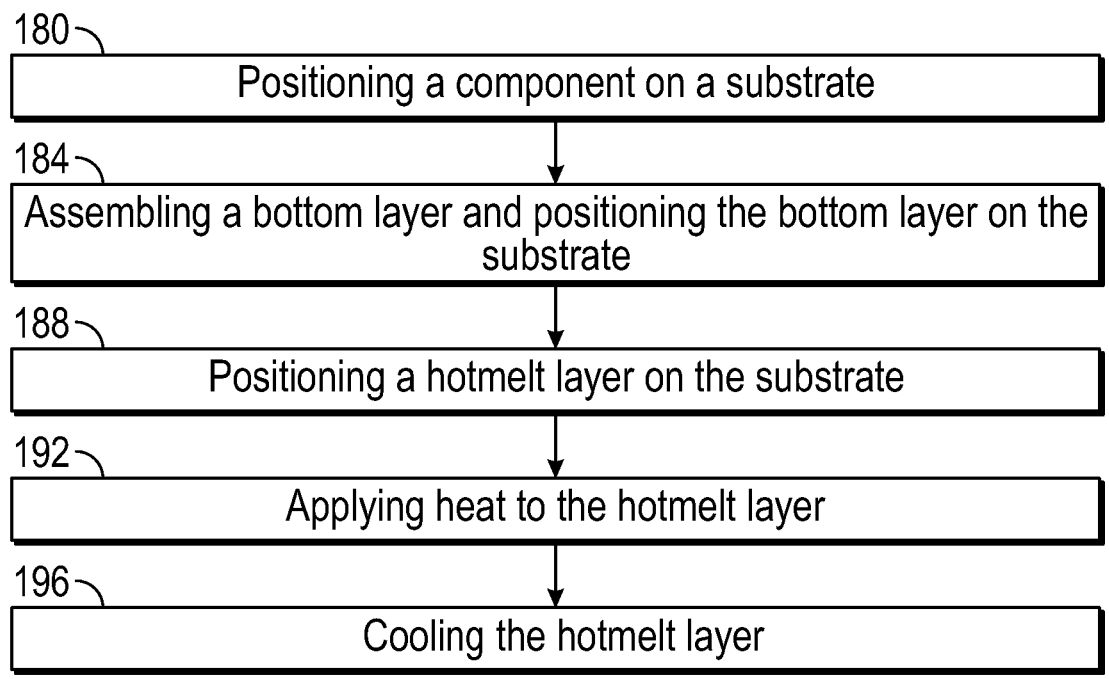
FIG. 3 is a flow diagram for manufacturing a hotmelt encapsulated electronic device in accordance with embodiments of the present disclosure.

FIG. 3 shows a sequence for manufacturing a flexible electronic device with a hotmelt layer. First, electronic components can be positioned 180 on a substrate. This positioning can include a direct connection between the electronic component and the substrate. In various embodiments, a reinforcement layer can be used to join an electronic component to a flexible substrate to prevent stresses from accumulating on the electronic component and damaging the electronic component as the substrate flexes. Next, a bottom layer, including a hotmelt layer, can be assembled 184 and positioned on the bottom surface of the substrate. Then, a hotmelt layer can be positioned 188 on the substrate over the at least one electronic component on the substrate. Heat and/or pressure can be applied 192 to the components to cause the hotmelt layer to flow into the spaces between electronic components on the substrate. Lastly, the hotmelt layer can be cooled 196 to form a waterproof layer over the at least one electronic component. It will be appreciated that this sequence is exemplary in nature, and operations can be eliminated in some manufacturing processes with other operations added. Further still, manufacturing processes can have a different sequence of operations.

Figure 4A:
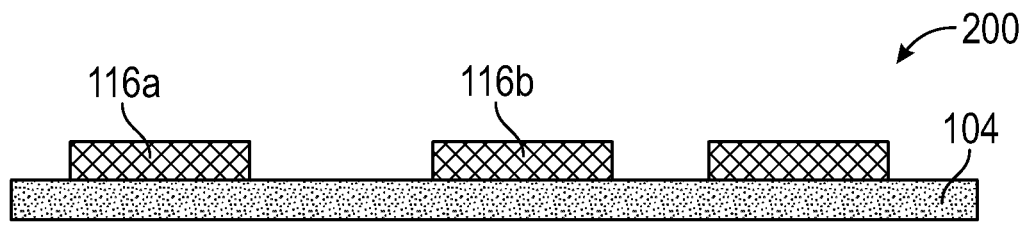
FIG. 4A is a cross-sectional side view of a substrate and components in accordance with embodiments of the present disclosure.
Figure 4B:
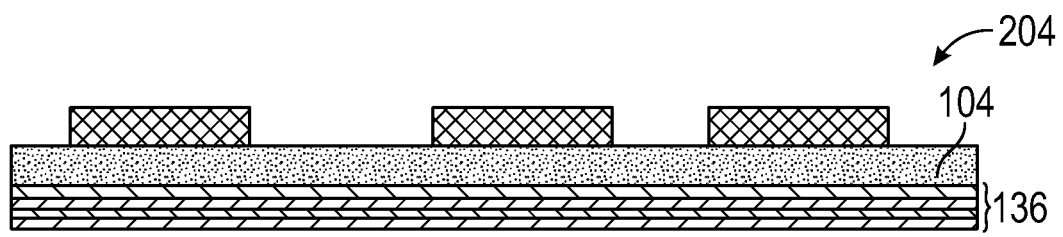
FIG. 4B is a cross-sectional side view of a substrate and a bottom layer in accordance with embodiments of the present disclosure.
Figure 4C:
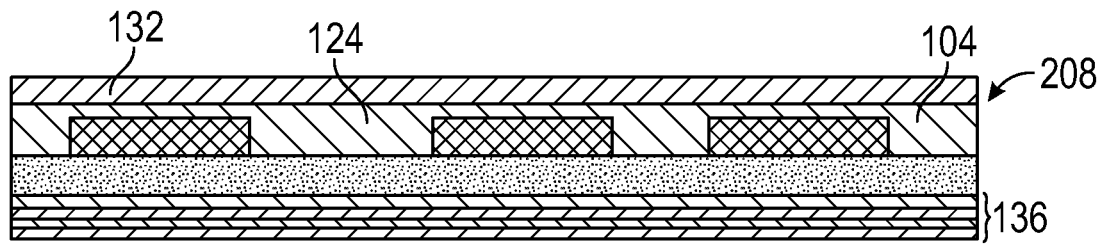
FIG. 4C is a cross-sectional side view of a substrate and a hotmelt layer in accordance with embodiments of the present disclosure.

FIGS. 4A-4C show a sequence for assembling and manufacturing a flexible electronic device. First, the electronic components 116a, 116b are positioned 200 on the substrate 104 along with any necessary wires, circuitry, etc. Then, a bottom layer 136, as described elsewhere herein, is positioned 204 on the bottom surface of the substrate 104. Lastly, a hotmelt layer 124 and a cover layer 132 are positioned 208 on the electronic components and the substrate 104 where heat and/or pressure causes the hotmelt layer or layers to flow between the electronic components 116a, 116b and onto the substrate 104.

Figure 5A:
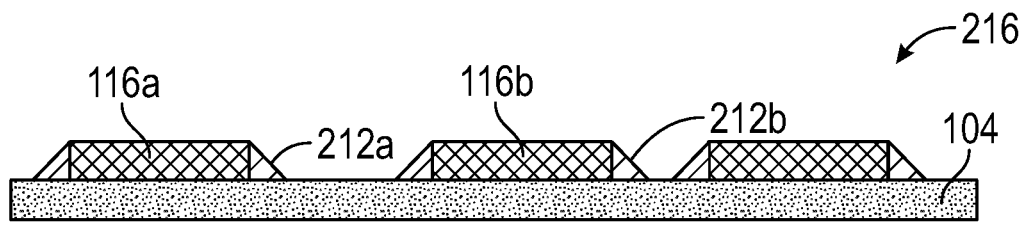
FIG. 5A is a cross-sectional side view of a substrate and components in accordance with embodiments of the present disclosure.
Figure 5B:
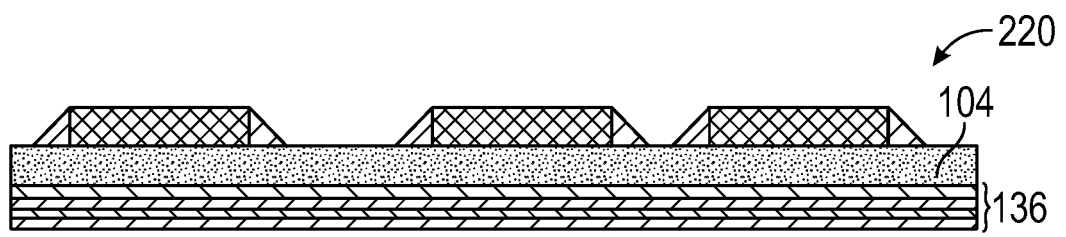
FIG. 5B is a cross-sectional side view of a substrate and a bottom layer in accordance with embodiments of the present disclosure.
Figure 5C:
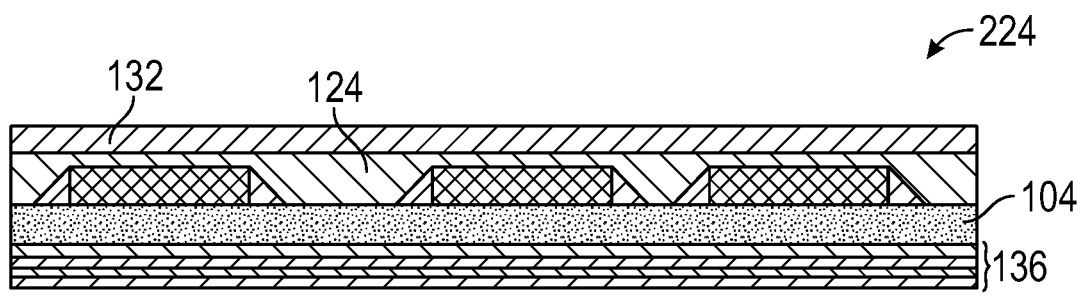
FIG. 5C is a cross-sectional side view of a substrate and a hotmelt layer in accordance with embodiments of the present disclosure.
Figure 6A:
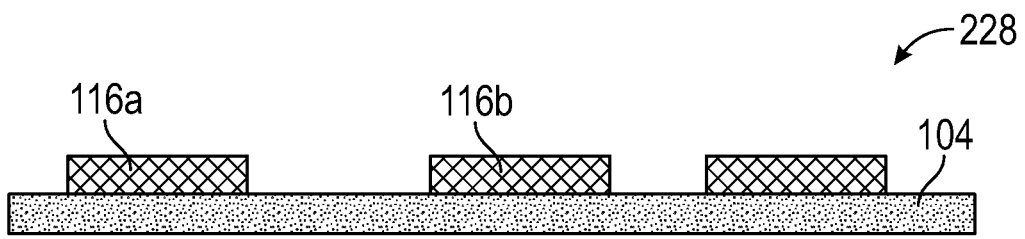
FIG. 6A is a cross-sectional side view of a substrate and components in accordance with embodiments of the present disclosure.
Figure 6B:
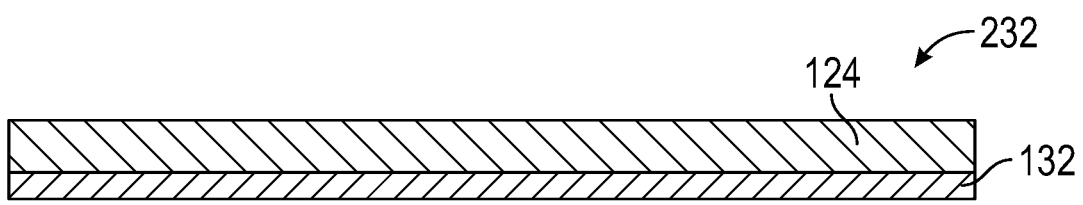
FIG. 6B is a cross-sectional side view of a hotmelt layer in accordance with embodiments of the present disclosure.
Figure 6C:
FIG. 6C is a cross-sectional side view of a bottom layer in accordance with embodiments of the present disclosure.
Figure 6D:
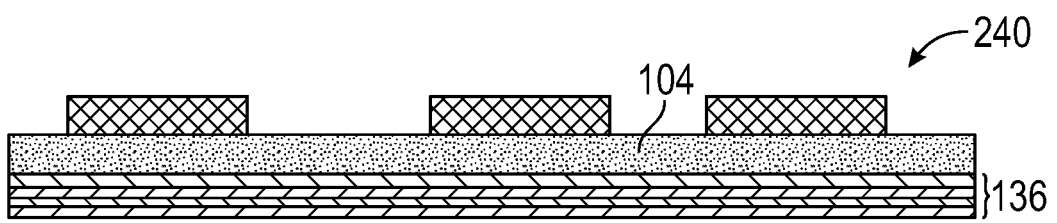
FIG. 6D is a cross-sectional side view of a substrate and a bottom layer in accordance with embodiments of the present disclosure.
Figure 6E:
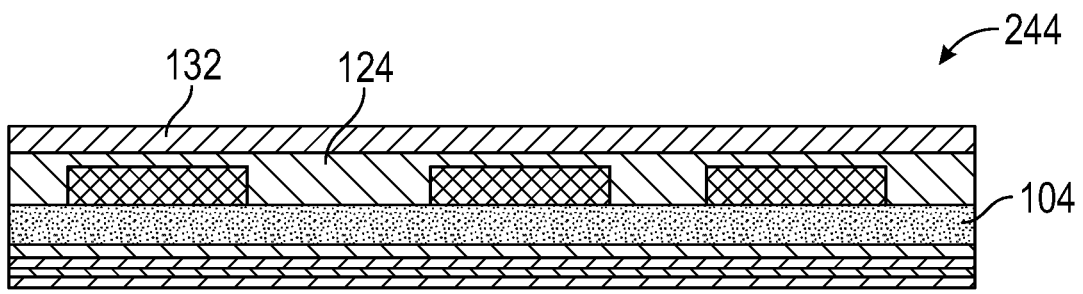
FIG. 6E is a cross-sectional side view of a substrate and a hotmelt layer in accordance with embodiments of the present disclosure.
Figure 7A:
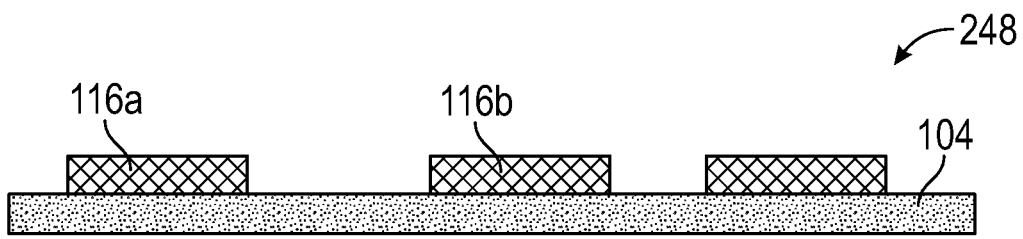
FIG. 7A is a cross-sectional side view of a substrate and components in accordance with embodiments of the present disclosure.
Figure 7B:
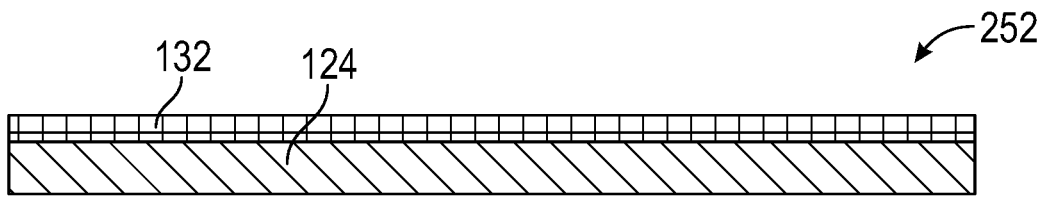
FIG. 7B is a cross-sectional side view of a hotmelt layer in accordance with embodiments of the present disclosure.
Figure 7C:
FIG. 7C is a cross-sectional side view of a bottom layer in accordance with embodiments of the present disclosure.
Figure 7D:
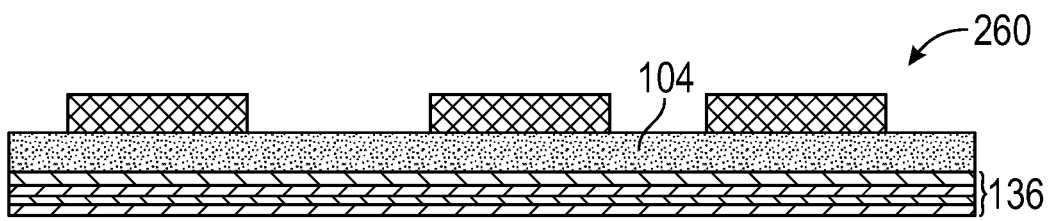
FIG. 7D is a cross-sectional side view of a substrate and a bottom layer in accordance with embodiments of the present disclosure.
Figure 7E:
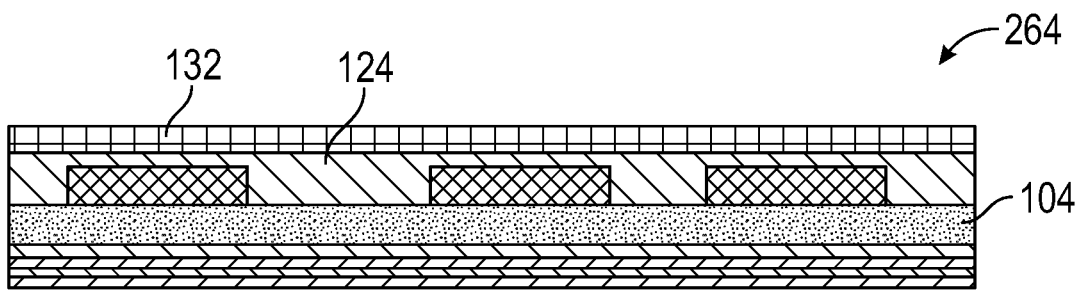
FIG. 7E is a cross-sectional side view of a substrate and a hotmelt layer in accordance with embodiments of the present disclosure.

FIGS. 5A-5C show another sequence for assembling and manufacturing a flexible electronic device. First, the electronic components 116a, 116b are positioned 216 on the substrate 104 along with any necessary wires, circuitry, etc. In addition, reinforcement layers 212a, 212b can be dispensed around the electronic components 116a, 116b, respectively. Since the substrate 104 can be made of a substantially flexible material and the electronic components 116a, 116b are typically rigid in nature, stresses and forces can concentrate on the electronic components 116a, 116b as the substrate 104 stretches and flexes. This concentration of stresses damages the electronic components 116a, 116b. By connecting reinforcement layers 212a, 212b to the electronic components 116a, 116b and the substrate 104, the stresses concentrate on the reinforcement layers 212a, 212b rather than the electronic components 116a, 116b. The reinforcement layers 212a, 212b can be, in some embodiments, an acrylic or epoxy material and have a flexural modulus that is greater than the flexural modulus of the substrate 104. The reinforcement layers 212a, 212b can include a separate curing process whereby, for example, heat or electromagnetic radiation is applied to the reinforcement layers 212a, 212b to cure these layers 212a, 212b.

Then, a bottom layer 136, as described elsewhere herein, is positioned 220 on the bottom surface of the substrate 104. Lastly, a hotmelt layer 124 and a cover layer 132 are positioned 224 on the electronic components and the substrate 104 where heat and/or pressure applied to the device causes the hotmelt layer or layers to flow between the electronic components 116a, 116b and onto the top surface of the substrate 104.

FIGS. 6A-6E show a further sequence for assembling and manufacturing a flexible electronic device. First, the electronic components 116a, 116b are positioned 228 on the substrate 104 along with any necessary wires, circuitry, etc. Next, a hotmelt layer 124 is poured onto a cover layer 132 to join 232 the hotmelt layer 124 and the cover layer 132. In various embodiments, a hotmelt coater or slot die coater is used to pour the hotmelt layer 124 onto the cover layer 132. However, it will be appreciated that other processes can be used to pour the hotmelt layer 124 onto the cover layer 132. Similarly, the various layers of the bottom layer 136 can be separately combined 236. The various layers that comprise the bottom layer 136 can include one or more of the layers described herein, such as the hotmelt layer, the support layer, the adhesive layer, and the liner film. Then, the bottom layer 136 is positioned 240 on the bottom surface of the substrate. Lastly, the hotmelt layer 124 and the cover layer 132 are positioned 244 on the electronic components and the substrate 104 where heat and/or pressure applied to the device causes the hotmelt layer or layers to flow between the electronic components 116a, 116b and onto the substrate 104.

FIGS. 7A-7E show a further sequence for assembling and manufacturing a flexible electronic device. First, the electronic components 116a, 116b are positioned 248 on the substrate 104 along with any necessary wires, circuitry, etc. Next, a hotmelt layer 124 is laminated onto a fabric cover layer 132 to join 252 the hotmelt layer 124 and the cover layer 132. The fabric cover layer 132 can be selected for a particular tactile sensation, characteristic, or feel for a consumer. Similarly, the various layers of the bottom layer 136 can be separately combined 256. The various layers that comprise the bottom layer 136 can include one or more of the layers described herein, such as the hotmelt layer, the support layer, the adhesive layer, and the liner film. Then, the bottom layer 136 is positioned 260 on the bottom surface of the substrate. Lastly, the hotmelt layer 124 and the cover layer 132 are positioned 264 on the electronic components and the substrate 104 where heat and/or pressure applied to the device causes the hotmelt layer or layers to flow between the electronic components 116a, 116b and onto the substrate 104.

Figure 8A:
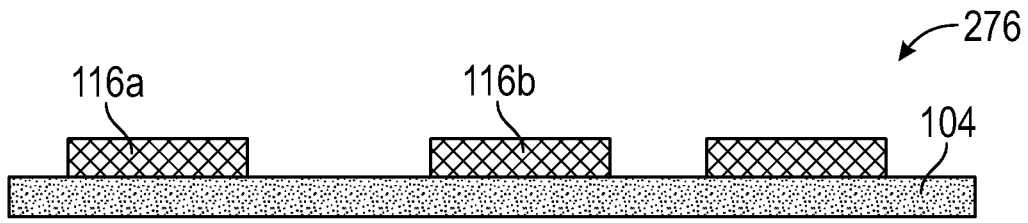
FIG. 8A is a cross-sectional side view of a substrate and components in accordance with embodiments of the present disclosure.
Figure 8B:
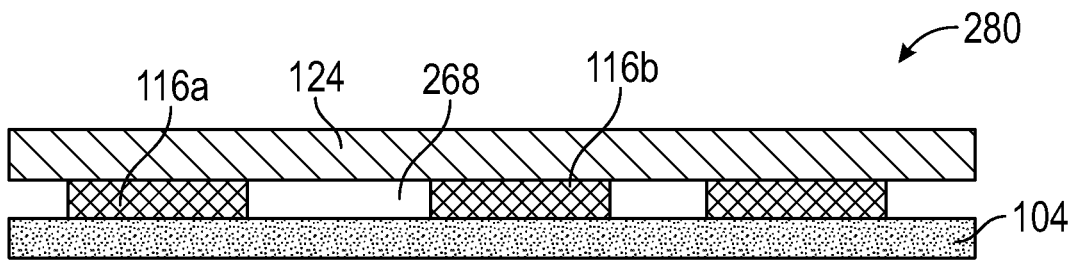
FIG. 8B is a cross-sectional side view of a substrate and a hotmelt layer in accordance with embodiments of the present disclosure.
Figure 8C:
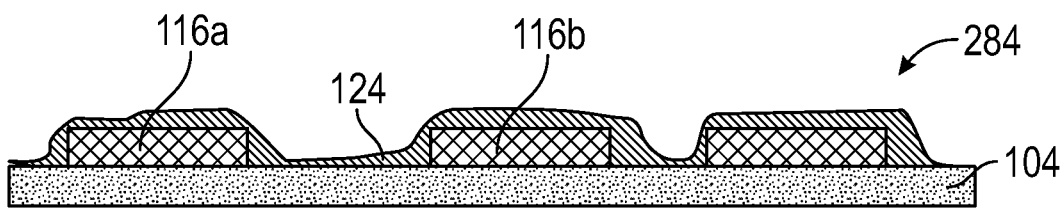
FIG. 8C is a cross-sectional side view of a substrate with the hotmelt layer flowing between components in accordance with embodiments of the present disclosure.

FIGS. 8A-8D show a sequence for assembling and manufacturing a flexible electronic device. First, the electronic components 116a, 116b are positioned 276 on the substrate 104 along with any necessary wires, circuitry, etc. Then, a hotmelt layer 124 is positioned over the electronic components 116a, 116b, and a space 268 is defined between the electronic components 116a, 116b and between the top surface of the substrate 104 and an inner surface of the hotmelt layer 124. Heat and/or pressure are applied 284 to the combination of layers, which causes the hotmelt layer 124 to flow into the space 268. In some embodiments, a vacuum laminator is used to form the hotmelt layer 124 onto the components 116 and the substrate 104, and the result of the hotmelt layer 124 flowing is shown in FIG. 8C. As shown, the outer surface of the hotmelt layer 124 is unevenly distributed around the electronic components 116a, 116b, and an outer surface of the hotmelt layer 124 is a varying distance from the top surface of the substrate 124. The outer surface of the hotmelt layer 124 can be characterized as having a local maximum height above the top surface of the substrate 104 over an electronic component 116 and as having a local minimum height above the top surface of the substrate 104 between electronic components 116. In some instances, a local minimum height can be less than a component height of one of the electronic components. This arrangement may not always be desirable as an uneven hotmelt layer 124 may provide a waterproof layer over the electronic components 116a, 116b but may also catch an edge or otherwise cause issues when the flexible electronic device is used.

Figure 8D:
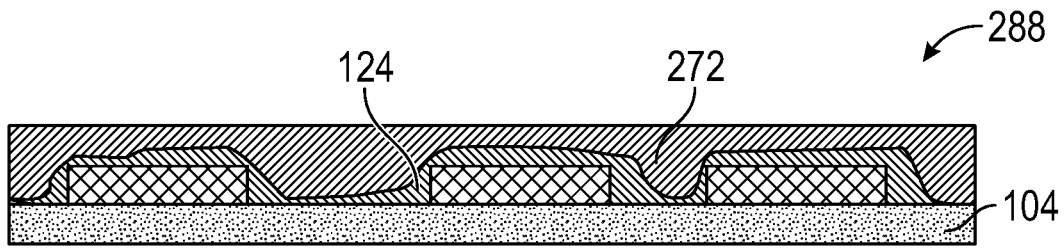
FIG. 8D is a cross-sectional side view of a substrate and a level layer in accordance with embodiments of the present disclosure.

In FIG. 8D, a further level layer 272 is applied 288 to the outer surface of the hotmelt layer 124. This level layer 272 has an inner surface that matches the varying outer surface of the hotmelt layer 124 and has an outer surface that is a constant height above the top surface of the substrate 104 such that the outer surface of the flexible electronic device is smooth and even. The level layer 272 can be a thermoplastic polyurethane in some embodiments, for example, a TPU foam. This TPU foam provides a planar outer surface, and a layer that is compliant and aesthetic.

The present disclosure, in various aspects, embodiments, and configurations, includes components, methods, processes, systems and/or apparatus substantially as depicted and described herein, including various aspects, embodiments, configurations, subcombinations, and subsets thereof. Those of skill in the art will understand how to make and use the various aspects, aspects, embodiments, and configurations, after understanding the present disclosure. The present disclosure, in various aspects, embodiments, and configurations, includes providing devices and processes in the absence of items not depicted and/or described herein or in various aspects, embodiments, and configurations hereof, including in the absence of such items as may have been used in previous devices or processes, e.g., for improving performance, achieving ease and\or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more, aspects, embodiments, and configurations for the purpose of streamlining the disclosure. The features of the aspects, embodiments, and configurations of the disclosure may be combined in alternate aspects, embodiments, and configurations other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed aspects, embodiments, and configurations. Thus, the following claims are hereby incorporated into this Detailed Description, with each claim standing on its own as a separate preferred embodiment of the disclosure.

Moreover, though the description of the disclosure has included description of one or more aspects, embodiments, or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

One particular embodiment of the present disclosure is a flexible electronic device, comprising a flexible planar substrate having a top surface and a bottom surface; a first component positioned on the top surface of the substrate and extending above the top surface by a first component height; a second component positioned on the top surface of the substrate and extending above the top surface by a second component height, wherein a space is formed between the top surface of the substrate and the first and second components; and a hotmelt layer positioned on the top surface of the substrate and the first and second components to encapsulate the first and second components, wherein the hotmelt layer at least partially fills the space between the top surface of the substrate and the first and second components.

In some embodiments of the disclosure, the hotmelt layer has an outer surface that is a constant height above the top surface of the substrate, and the constant height of the hotmelt layer is greater than the first component height and greater than the second component height. In various embodiments of the disclosure, the hotmelt height is equal to or greater than 0.5 mm. In some embodiments of the disclosure, the hotmelt layer has an outer surface that is a varying height above the top surface of the substrate.

In various embodiments of the disclosure, the flexible electronic device further comprises a level layer positioned on the outer surface of the hotmelt layer, wherein the level layer has an outer surface that is a constant height above the top surface of the substrate. In some embodiments of the disclosure, the flexible electronic device further comprises a bottom layer positioned on the bottom surface of the substrate, wherein the bottom layer comprises a second hotmelt layer positioned on the bottom surface of the substrate; a support layer positioned on an outer surface of the second hotmelt layer; a pressure sensitive adhesive positioned on an outer surface of the support layer; and a liner film positioned on an outer surface of the pressure sensitive adhesive. In various embodiments of the disclosure, the hotmelt layer is at least one of a ethylene-vinyl acetate material, a thermoplastic polyurethane material, a silicone material, a polyamide material, an amorphous poly alpha olefins material, or a polyethylene material.

Another particular embodiment of the present disclosure is a method of manufacturing a flexible circuit board, comprising providing a flexible planar substrate having a top surface and a bottom surface; positioning a first component and a second component on the top surface of the substrate, wherein the first component extends above the top surface by a first distance, and the second component extends above the top surface by a second distance; positioning a hotmelt layer on the top surface of the substrate and the first and second components at a first temperature, wherein a space is defined by the top surface of the substrate, an inner surface of the hotmelt layer, and the first and second components; and applying heat to the hotmelt layer at a second temperature that is at least 50° C. greater than the first temperature to cause the hotmelt layer to flow into the space between the first and second components to form a waterproof layer over the first and second components, wherein the second temperature is less than 150° C.

In various embodiments of the disclosure, the hotmelt layer has an outer surface that is a constant height above the top surface of the substrate, and the constant height of the hotmelt layer is greater than the first component height and greater than the second component height. In some embodiments of the disclosure, the method further comprises positioning a cover layer on an outer surface of the hotmelt layer prior to applying heat to the hotmelt layer.

In various embodiments of the present disclosure, the heat applied to the hotmelt layer is provided by at least one of a heated roller, a heating band, or a hot wedge. In some embodiments of the present disclosure, the method further comprises positioning a level layer on the hotmelt layer, wherein an outer surface of the hotmelt layer is a varying distance from the top surface of the substrate, and an outer surface of the level layer is a constant distance from the top surface of the substrate. In various embodiments of the present disclosure, the level layer is a thermoplastic polyurethane foam. In some embodiments of the present disclosure, the method further comprises cooling the hotmelt layer at a third temperature that less than the second temperature.

Yet another particular embodiment of the present disclosure is a method of manufacturing a flexible circuit board, comprising providing a flexible planar substrate having a top surface and a bottom surface; positioning a first component and a second component above the top surface of the substrate, wherein the first component extends above the top surface by a first distance, and the second component extends above the top surface by a second distance; positioning a hotmelt layer above the top surface of the substrate and the first and second components, wherein a space is defined by the top surface of the substrate, an inner surface of the hotmelt layer, and the first and second components; and applying heat to the hotmelt layer at a first temperature that is between 60 and 150° C. to cause the hotmelt layer to flow into the space between the first and second components to form a waterproof layer over the first and second components, wherein an outer surface of the hotmelt layer is a substantially constant height above the top surface of the substrate.

In some embodiments of the present disclosure, the method further comprises drawing, by at least one roller, the hotmelt layer from a hotmelt roll; and drawing, by the at least one roller, the substrate from a substrate roll. In various embodiments of the present disclosure, the method further comprises casting the hotmelt layer onto a cover layer prior to positioning the hotmelt layer on the top surface of the substrate and the first and second components. In some embodiments of the present disclosure, the constant height of the hotmelt layer is equal to or greater than 0.5 mm.

In various embodiments of the present disclosure, the method further comprises connecting a reinforcement layer to the first component and to the top surface of the substrate, wherein a flexural modulus of the reinforcement layer is greater than a flexural modulus of the substrate and greater than a flexural modulus of the hotmelt layer. In some embodiments of the present disclosure the method further comprises cooling the hotmelt layer at a second temperature that less than the first temperature.

The following definitions may be used in this disclosure.

"A" or "an" entity refers to one or more of that entity. As such, the terms "a" (or "an"), "one or more" and "at least one" can be used interchangeably herein. It is also to be noted that the terms "comprising", "including", and "having" can be used interchangeably.

"At least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together. When each one of A, B, and C in the above expressions refers to an element, such as X, Y, and Z, or class of elements, such as $X_1$-$X_n$, $Y_1$-$Y_m$, and $Z_1$-$Z_o$, the phrase is intended to refer to a single element selected from X, Y, and Z, a combination of elements selected from the same class (e.g., $X_1$ and $X_2$) as well as a combination of elements selected from two or more classes (e.g., $Y_1$ and $Z_o$).

The term "automatic" and variations thereof refer to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

The term "computer-readable medium" refers to any computer-readable storage and/or transmission medium that participate in providing instructions to a processor for execution. Such a computer-readable medium can be tangible, non-transitory, and non-transient and take many forms, including but not limited to, non-volatile media, volatile media, and transmission media and includes without limitation random access memory ("RAM"), read only memory ("ROM"), and the like. Non-volatile media includes, for example, NVRAM, or magnetic or optical disks. Volatile media includes dynamic memory, such as main memory. Common forms of computer-readable media include, for example, a floppy disk (including without limitation a Bernoulli cartridge, ZIP drive, and JAZ drive), a flexible disk, hard disk, magnetic tape or cassettes, or any other magnetic medium, magneto-optical medium, a digital video disk (such as CD-ROM), any other optical medium, punch cards, paper tape, any other physical medium with patterns of holes, a RAM, a PROM, and EPROM, a FLASH-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored. Computer-readable storage medium commonly excludes transient storage media, particularly electrical, magnetic, electromagnetic, optical, magneto-optical signals.

A "computer readable storage medium" may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may be any computer readable medium that is not a computer readable storage medium and that can communicate, propagate, or transport a program for use by or in connection with an instruction execution system, apparatus, or device. A computer readable signal medium may convey a propagated data signal with computer readable program code embodied therein, for example, in baseband or as part of a carrier wave. Such a propagated signal may take any of a variety of forms, including, but not limited to, electro-magnetic, optical, or any suitable combination thereof. Program code embodied on a computer readable signal medium may be transmitted using any appropriate medium, including but not limited to wireless, wireline, optical fiber cable, RF, etc., or any suitable combination of the foregoing.

The terms "determine", "calculate" and "compute," and variations thereof, are used interchangeably and include any type of methodology, process, mathematical operation or technique.

"Means" shall be given its broadest possible interpretation in accordance with 35 U.S.C. § 112(f). Accordingly, a claim incorporating the term "means" shall cover all structures, materials, or acts set forth herein, and all of the equivalents thereof. Further, the structures, materials or acts and the equivalents thereof shall include all those described in the summary of the disclosure, brief description of the drawings, detailed description, abstract, and claims themselves.

The term "module" refers to any known or later developed hardware, software, firmware, artificial intelligence, fuzzy logic, or combination of hardware and software that is capable of performing the functionality associated with that element.

What is claimed is:

1. A flexible electronic device, comprising:
   a flexible planar substrate having a top surface and a bottom surface;
   a first component positioned on the top surface of the flexible planar substrate and extending above the top surface by a first component height;
   a second component positioned on the top surface of the flexible planar substrate and extending above the top surface by a second component height, wherein a space is defined by the top surface of the flexible planar substrate and between side surfaces of the first and second components;
   a hotmelt layer positioned on the top surface of the flexible planar substrate and the first and second components to encapsulate the first and second components, wherein the hotmelt layer at least partially fills the space defined by the top surface of the flexible planar substrate and side surfaces of the first and second components, and the hotmelt layer contacts the top surface of the flexible planar substrate, wherein the hotmelt layer has an outer surface that is a varying height above the top surface of the flexible planar substrate; and
   a level layer positioned on the outer surface of the hotmelt layer, wherein the level layer has an outer surface that is a constant height above the top surface of the flexible planar substrate and has a varying inner surface that matches the outer surface of the hotmelt layer that has a varying height above the top surface of the flexible planar substrate.

2. The flexible electronic device of claim 1, further comprising:
   a bottom layer positioned on the bottom surface of the flexible planar substrate, wherein the bottom layer comprises:
      a second hotmelt layer positioned on the bottom surface of the flexible planar substrate;
      a support layer positioned on an outer surface of the second hotmelt layer;
      a pressure sensitive adhesive positioned on an outer surface of the support layer; and
      a liner film positioned on an outer surface of the pressure sensitive adhesive.

3. The flexible electronic device of claim 1, wherein the hotmelt layer is at least one of an ethylene-vinyl acetate material, a thermoplastic polyurethane material, a silicone material, a polyamide material, an amorphous poly alpha olefins material, or a polyethylene material.

4. The flexible electronic device of claim 1, further comprising:
   a reinforcement layer connected to a side surface of the first component and to the top surface of the flexible planar substrate, wherein a flexural modulus of the reinforcement layer is greater than a flexural modulus of the flexible planar substrate and greater than a flexural modulus of the hotmelt layer.

5. A method of manufacturing a flexible electronic device, comprising:
   providing a flexible planar substrate having a top surface and a bottom surface;
   positioning a first component and a second component above the top surface of the flexible planar substrate, wherein the first component extends above the top surface by a first distance, and the second component extends above the top surface by a second distance;
   connecting a reinforcement layer to a side surface of the first component and to the top surface of the flexible planar substrate;
   positioning a hotmelt layer above the top surface of the flexible planar substrate and the first and second components, wherein a space is defined by the top surface of the flexible planar substrate, an inner surface of the hotmelt layer, and the first and second components, and wherein a flexural modulus of the reinforcement layer is greater than a flexural modulus of the flexible planar substrate and greater than a flexural modulus of the hotmelt layer; and
   applying heat to the hotmelt layer at a first temperature that is between 60 and 150° C. to cause the hotmelt layer to flow into the space between the first and second components to form a waterproof layer over the first and second components, wherein an outer surface of the hotmelt layer is a substantially constant height above the top surface of the flexible planar substrate.

6. The method of claim 5, further comprising:
   drawing, by at least one roller, the hotmelt layer from a hotmelt roll; and
   drawing, by the at least one roller, the flexible planar substrate from a substrate roll.

7. The method of claim 5, further comprising:
   casting the hotmelt layer onto a cover layer prior to positioning the hotmelt layer on the top surface of the flexible planar substrate and the first and second components.

8. The method of claim 5, wherein a constant height of the hotmelt layer is equal to or greater than 0.5 mm.

9. The method of claim 5, further comprising:
   cooling the hotmelt layer at a second temperature that less than the first temperature.

10. A flexible electronic device, comprising:
    a flexible planar substrate having a top surface and a bottom surface;
    a first component positioned on the top surface of the flexible planar substrate and extending above the top surface by a first component height;
    a second component positioned on the top surface of the flexible planar substrate and extending above the top surface by a second component height, wherein a space is defined by the top surface of the flexible planar substrate and between side surfaces of the first and second components;
    a hotmelt layer positioned on the top surface of the flexible planar substrate and the first and second components to encapsulate the first and second components, wherein the hotmelt layer at least partially fills the space defined by the top surface of the flexible planar substrate and side surfaces of the first and second components, and the hotmelt layer contacts the top surface of the flexible planar substrate; and
    a reinforcement layer connected to a side surface of the first component and to the top surface of the flexible planar substrate, wherein a flexural modulus of the reinforcement layer is greater than a flexural modulus of the flexible planar substrate and greater than a flexural modulus of the hotmelt layer.

11. The flexible electronic device of claim 10, wherein the hotmelt layer has an outer surface that is a constant height above the top surface of the flexible planar substrate, and the constant height of the hotmelt layer is greater than the first component height and greater than the second component height.

12. The flexible electronic device of claim 11, wherein the constant height of the hotmelt layer is equal to or greater than 0.5 mm.

13. The flexible electronic device of claim 10, wherein the hotmelt layer has an outer surface that is a varying height above the top surface of the flexible planar substrate.

14. The flexible electronic device of claim 13, further comprising:
    a level layer positioned on the outer surface of the hotmelt layer, wherein the level layer has an outer surface that is a constant height above the top surface of the flexible planar substrate and has a varying inner surface that matches the outer surface of the hotmelt layer that has a varying height above the top surface of the flexible planar substrate.

15. The flexible electronic device of claim 10, further comprising:
    a bottom layer positioned on the bottom surface of the flexible planar substrate, wherein the bottom layer comprises:
    a second hotmelt layer positioned on the bottom surface of the flexible planar substrate;
    a support layer positioned on an outer surface of the second hotmelt layer;
    a pressure sensitive adhesive positioned on an outer surface of the support layer; and
    a liner film positioned on an outer surface of the pressure sensitive adhesive.

16. The flexible electronic device of claim 10, wherein the hotmelt layer is at least one of an ethylene-vinyl acetate material, a thermoplastic polyurethane material, a silicone material, a polyamide material, an amorphous poly alpha olefins material, or a polyethylene material.

* * * * *